(12) United States Patent
Harauchi et al.

(10) Patent No.: US 11,496,102 B2
(45) Date of Patent: Nov. 8, 2022

(54) AMPLIFIER

(71) Applicant: Mitsubishi Electric Corporation, Tokyo (JP)

(72) Inventors: Kenji Harauchi, Tokyo (JP); Yoshinobu Sasaki, Tokyo (JP); Miyo Miyashita, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 92 days.

(21) Appl. No.: 17/045,238

(22) PCT Filed: May 28, 2018

(86) PCT No.: PCT/JP2018/020315
§ 371 (c)(1),
(2) Date: Oct. 5, 2020

(87) PCT Pub. No.: WO2019/229795
PCT Pub. Date: Dec. 5, 2019

(65) Prior Publication Data
US 2021/0167741 A1 Jun. 3, 2021

(51) Int. Cl.
*H03F 3/193* (2006.01)
*H03F 1/56* (2006.01)
*H01L 23/66* (2006.01)

(52) U.S. Cl.
CPC ............ *H03F 3/193* (2013.01); *H01L 23/66* (2013.01); *H03F 1/565* (2013.01);
(Continued)

(58) Field of Classification Search
CPC .... H03F 3/193; H03F 1/565; H03F 2200/318; H03F 2200/451; H03F 2200/453;
(Continued)

(56) References Cited

U.S. PATENT DOCUMENTS

2005/0231278 A1  10/2005  Blednov
2010/0140721 A1   6/2010  Takagi
(Continued)

FOREIGN PATENT DOCUMENTS

JP   H06-310955 A   11/1994
JP   H07-74549 A    3/1995
(Continued)

OTHER PUBLICATIONS

International Search Report; Written Opinion; and Notification of Transmittal of the International Search Report and the Written Opinion of the International Searching Authority, or the Declaration issued in PCT/JP2018/020315; dated Aug. 14, 2018.
(Continued)

*Primary Examiner* — Hieu P Nguyen
(74) *Attorney, Agent, or Firm* — Studebaker & Brackett PC

(57) ABSTRACT

Provided are an input matching circuit, at least one amplifying transistor that receives a signal from the input matching circuit, a first dummy transistor that receives a signal from the input matching circuit, a second dummy transistor that receives a signal from the input matching circuit, and an output matching circuit that outputs an output of the amplifying transistor, the amplifying transistor being arranged between the first dummy transistor and the second dummy transistor, the amplifying transistor, the first dummy transistor, and the second dummy transistor being provided in a row along the input matching circuit.

5 Claims, 9 Drawing Sheets

(52) U.S. Cl.
CPC ............. *H01L 2223/6611* (2013.01); *H01L 2223/6655* (2013.01); *H03F 2200/318* (2013.01); *H03F 2200/451* (2013.01)

(58) Field of Classification Search
CPC .......... H03F 1/086; H03F 3/211; H03F 3/604; H03F 3/195; H01L 23/66; H01L 2223/6611; H01L 2223/6655; H01L 29/41758; H01L 29/4238; H01L 29/78
USPC ...................................... 330/295, 124 R, 286
See application file for complete search history.

(56) References Cited

U.S. PATENT DOCUMENTS

| | | | |
|---|---|---|---|
| 2011/0181350 A1 | 7/2011 | Takagi | |
| 2021/0203278 A1* | 7/2021 | Wei | H01L 23/552 |

FOREIGN PATENT DOCUMENTS

| JP | H08-102630 A | 4/1996 |
|---|---|---|
| JP | 2005-536922 A | 12/2005 |
| JP | 2010-021961 A | 1/2010 |
| JP | 2010-161348 A | 7/2010 |
| JP | 2011-171697 A | 9/2011 |
| JP | 2013-038603 A | 2/2013 |

OTHER PUBLICATIONS

Office Action issued in JP 2018-552258; mailed by the Japan Patent Office dated Jan. 8, 2019.
Office Action issued in JP 2018-552258; mailed by the Japan Patent Office dated Mar. 5, 2019.

* cited by examiner

AMPLIFIER

FIELD

The present invention relates to an amplifier.

BACKGROUND

PTL 1 illustrates, in the context of a field effect transistor of a multi-finger structure, a method of controlling the inductance distribution and ensuring that input and output signals have the same phase through adjusting the length, the diameter, and the number of bonding wires and changing the values of mutual inductance and self-inductance.

PRIOR ART

Patent Literature

[PTL 1] JP 2010-161348 A

SUMMARY

Technical Problem

In PTL 1, a scheme is adopted according to which, in order to carry out phase matching of the input and output signals, apparent inductance distribution is made uniform by controlling self-inductance of the transistor arranged at the end. In this case, it is difficult to make the inductance fully uniform due to the influence of manufacturing variations or the like. Further, if the temperature or operating power is changed and an RF current fluctuates, non-uniformity of the inductance distribution is multiplied by the fluctuation of the RF current, which makes it difficult to ensure that the input signals have the same amplitude and the same phase. In this case, a problem arises that the RF output becomes non-uniform and gain or output decreases.

The present invention has been made to solve the above-described problem and an object of the present invention is to provide an amplifier, which uses multiple amplifying transistors, capable of bringing the signal phase closer to a uniform state.

Means for Solving the Problems

According to this invention, an amplifier includes an input matching circuit, at least one amplifying transistor that receives a signal from the input matching circuit, a first dummy transistor that receives a signal from the input matching circuit, a second dummy transistor that receives a signal from the input matching circuit, and an output matching circuit that outputs an output of the amplifying transistor, wherein the amplifying transistor being arranged between the first dummy transistor and the second dummy transistor, and the amplifying transistor, the first dummy transistor, and the second dummy transistor being provided in a row along the input matching circuit.

Other features of the present invention will be disclosed below.

Advantageous Effects of Invention

According to this invention, the signal phase can be made closer to a uniform state by providing dummy transistors that do not contribute to output power at both ends of the amplifying transistors arranged in one row.

DESCRIPTION OF EMBODIMENTS

An amplifier in accordance with embodiments of the present invention will be described with reference to the drawings. The same or corresponding components will be denoted by the same reference signs and description thereof may not be repeated.

Embodiment 1

Figure 1:
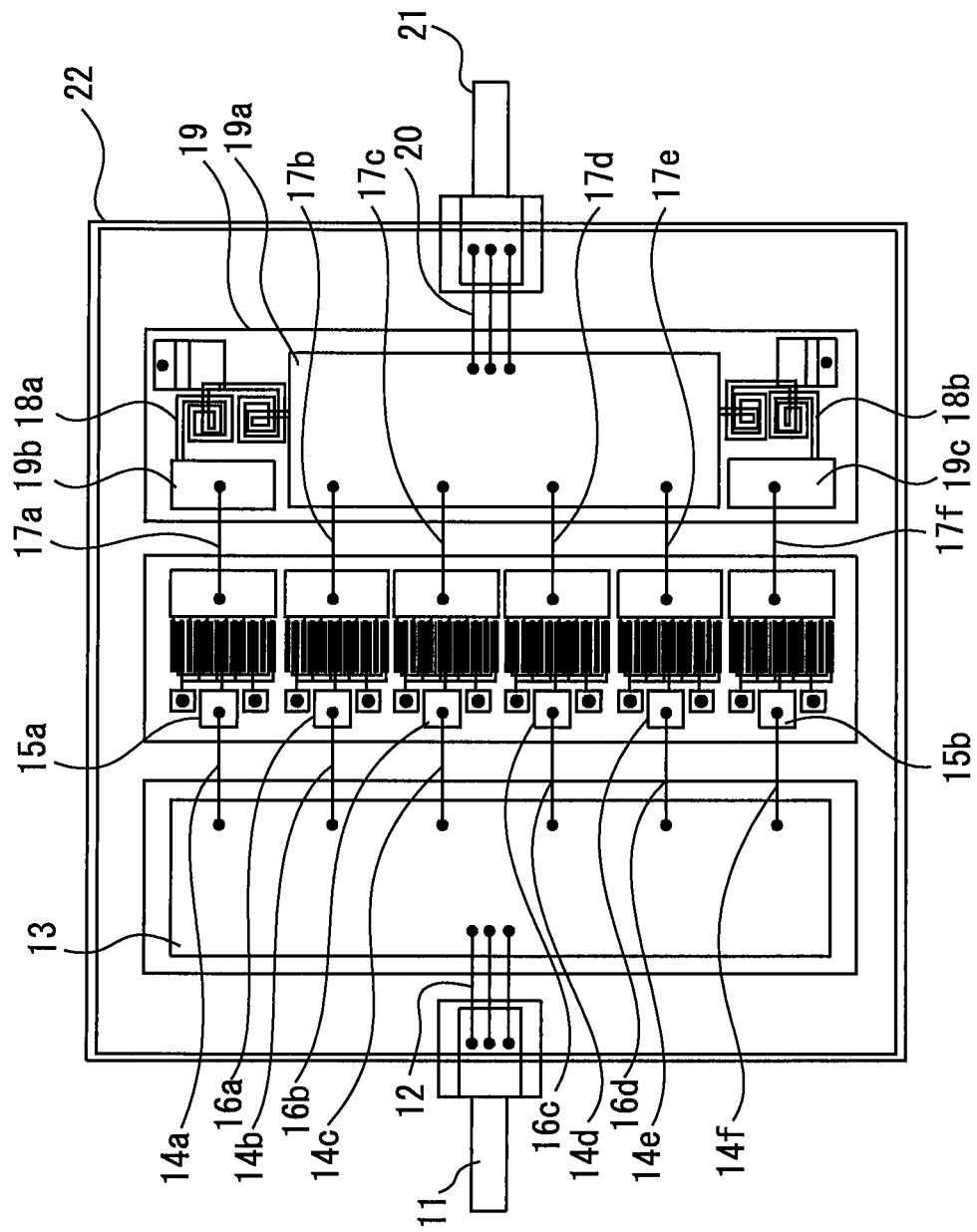
FIG. 1 is a plan view of an amplifier in accordance with Embodiment 1.

FIG. 1 is a plan view of an amplifier in accordance with Embodiment 1. The amplifier serves, for example, as a radio frequency power amplifier that amplifies radio frequency signals from microwave frequency band to millimeter wave frequency band. The amplifier includes, for example, an input terminal 11 to which a radio frequency signal is input. The input terminal 11 is connected by a bonding wire 12 to an input matching circuit 13. The input matching circuit 13 has, for example, an insulating substrate and a metal pattern provided thereon.

The input matching circuit 13 is connected, via bonding wires 14a, 14b, 14c, 14d, 14e, and 14f, to a first dummy transistor 15a, an amplifying transistor 16a, an amplifying transistor 16b, an amplifying transistor 16c, an amplifying transistor 16d, and a second dummy transistor 15b, respectively. The first dummy transistor 15a, the amplifying transistors 16a, 16b, 16c, 16d, and the second dummy transistor 15b receive signals from the input matching circuit 13 and amplify these signals. The number of the amplifying transistors is not in particular limited and one or more of them may be provided. At least one amplifying transistor is provided.

The amplifying transistors 16a, 16b, 16c, 16d, the first dummy transistor 15a, and the second dummy transistor 15b are provided in a row along the input matching circuit 13. The amplifying transistors 16a, 16b, 16c, and 16d are arranged between the first dummy transistor 15a and the second dummy transistor 15b. Specifically, the first dummy transistor 15a is provided at an end of the row in which the amplifying transistors 16a, 16b, 16c, 16d are provided so as to be adjacent thereto, and the second dummy transistor 15b is provided at the other end thereof so as to be adjacent thereto.

Figure 2:
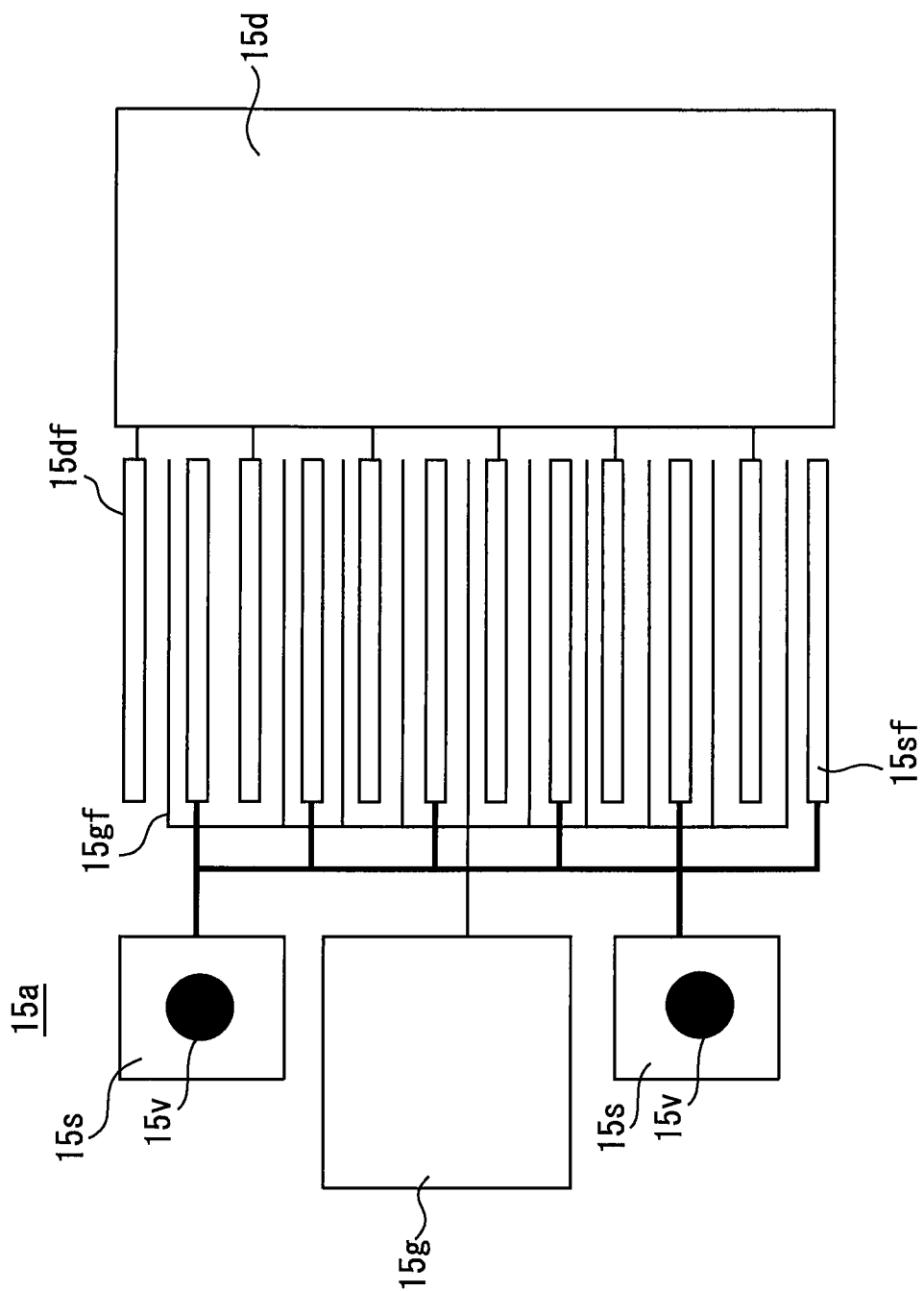
FIG. 2 is an enlarged view of a transistor.

For example, the same unit transistors can be used to configure the amplifying transistors 16a, 16b, 16c, 16d, the first dummy transistor 15a, and the second dummy transistor 15b. FIG. 2 is a diagram that illustrates an example of the configuration of such a unit transistor. The unit transistor has a gate pad 15g and a plurality of gate fingers 15gf connected to the gate pad 15g. Further, it includes a source pad 15s, a plurality of source fingers 15sf connected to the source pad 15s, a drain pad 15d, and a plurality of drain fingers 15df connected to the drain pad 15d. The source pad 15s is grounded by a via 15v. The bonding wire for inputting an input signal is connected to the gate pad 15g. The bonding wire for outputting is connected to the drain pad 15d. The length of the gate constituting the unit transistor, the width of the gate, the distance between the electrodes, etc. are specified according to the predefined output power.

The drain pads of the first dummy transistor 15a, the amplifying transistors 16a, 16b, 16c, 16d, and the second dummy transistor 15b are connected to an output matching circuit 19 via bonding wires 17a, 17b, 17c, 17d, 17e, and 17f, respectively. The output matching circuit 19 includes metal patterns 19a, 19b, 19c and interruption circuits 18a, 18b.

The bonding wires 17b, 17c, 17d, 17e are connected to the metal pattern 19a. The metal pattern 19a is connected via a bonding wire 20 to an output terminal 21. By virtue of this, the outputs of the amplifying transistors 16a, 16b, 16c, and 16d are output on the output terminal 21 via the bonding wires 17b, 17c, 17d, 17e, the metal pattern 19a, and the bonding wire 20.

In the meantime, the bonding wires 17a and 17f are connected to the metal pattern 19b, 19c, respectively. The metal pattern 19b is connected to the interruption circuit 18a and the metal pattern 19c is connected to the interruption circuit 18b. The interruption circuits 18a and 18b can be configured as any appropriate circuit that blocks outputs by the first dummy transistor 15a and the second dummy transistor 15b. As the interruption circuits 18a and 18b, for example, a configuration that has an LC matching circuit and a choke coil can be adopted. The outputs by the first dummy transistor 15a and the second dummy transistor 15b are blocked by the interruption circuits 18a and 18b, so that these outputs are not transmitted to the output terminal 21. Accordingly, the output matching circuit 19 outputs the outputs by the amplifying transistors 16a, 16b, 16c, and 16d but does not output the outputs by the first dummy transistor 15a and the second dummy transistor 15b. In other words, it only synthesizes the outputs from the amplifying transistors 16a, 16b, 16c, 16d by the metal pattern 19a and transmits the synthesized output to the output terminal 21.

The amplifier includes a package 22. The input terminal 11 and the output terminal 21 are fixed to the edges of the package 22. In addition, the input matching circuit 13, the first dummy transistor 15a, the amplifying transistors 16a, 16b, 16c, 16d, the second dummy transistor 15b, and the output matching circuit 19 are accommodated in the package 22.

Figure 3:
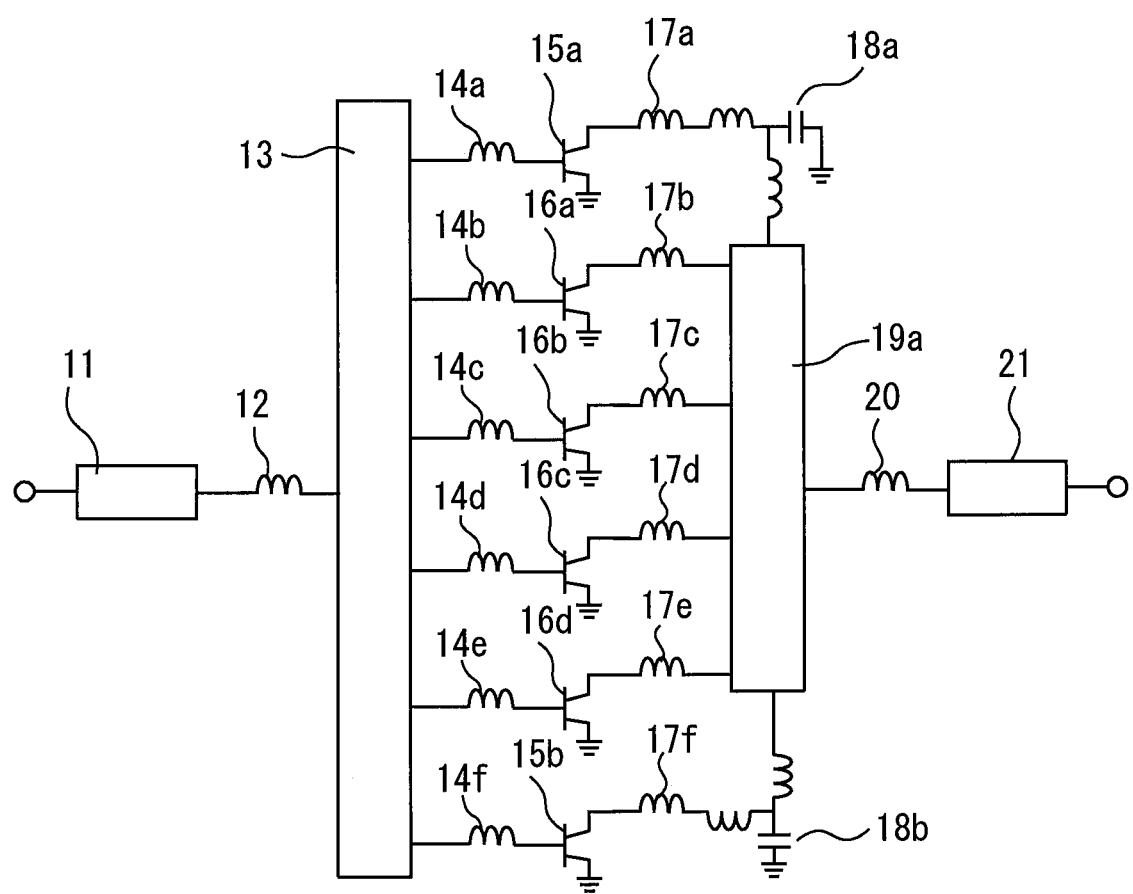
FIG. 3 is an equivalent circuit diagram.

FIG. 3 is a diagram that illustrates an example of an equivalent circuit of the amplifier of Embodiment 1. An RF input signal is input via the input terminal 11 of the package and then input via the bonding wire 12 to the input matching circuit 13. The input matching circuit 13 can be designed, for example, such that the RF signal is distributed among the individual transistors with the same amplitude and the same phase. In addition, the RF signal is input, from the input matching circuit 13, to the first dummy transistor 15a, the amplifying transistors 16a, 16b, 16c, 16d, and the second dummy transistor 15b. At this point, the bonding wires 14a, 14b, 14c, 14d, 14e, and 14f for transmitting signals to the individual transistors may have the same shape but their shapes or locations of connection may be modified as required.

The RF signals that have been output from the first dummy transistor 15a and the second dummy transistor 15b are blocked by the interruption circuits 18a and 18b which include, for example, an LC matching circuit and a choke coil and are not output on the output terminal 21. On the other hand, the RF signals that have been output from the amplifying transistors 16a, 16b, 16c, and 16d are subjected to power synthesis by the metal pattern 19a of the output matching circuit 19 designed to carry out, for example, the power synthesis with the same phase and the same amplitude, and the synthesized signal is output from the output terminal 21 via the bonding wire 20. In this manner, the two transistors positioned at both ends of the six transistors connected in parallel are configured as dummy transistors that do not contribute to RF output.

Here, inductance of the bonding wire 14a connected to the first dummy transistor 15a and the bonding wire 14f connected to the second dummy transistor 15b is given as L1 and inductance of the bonding wires 14b, 14c, 14d, 14e arranged between these bonding wires 14a, 14f is given as L2. In addition, it is assumed that the bonding wires 14a to 14f have the same shape and the same RF current flows in all of the transistors. If self-inductance is L and mutual inductance is M, then L1 and L2 can be obtained according to the following expressions:

$$L1 = L + M$$

$$L2 = L + 2M$$

It will be appreciated from these expressions that the inductance of the bonding wires 14a and 14f at the ends is smaller than the inductance of the inner bonding wires 14b, 14c, 14d, and 14e. Accordingly, when the signals that have passed through the bonding wires 14a to 14f are all connected to the output terminal 21, then imbalance of inductance occurs. However, in the amplifier in accordance with Embodiment 1, the first dummy transistor 15a and the second dummy transistor 15b are provided at both ends of the row in which the transistors are provided, and the outputs of these transistors are blocked by the interruption circuits 18a and 18b. By virtue of this, it is made possible to avoid the influence of the wires having relatively small mutual inductance M upon the outputs. In other words, it is made possible to avoid arrangement of amplifying transistors at the ends of the row in which the transistors are provided and to eliminate the need of arranging the amplifying transistors, whose propagation signal phases need to be aligned, at the ends where inductance distribution is disturbed.

In this manner, by providing the first dummy transistor 15a and the second dummy transistor 15b, it is made possible to suppress the decrease in the inductance of the amplifying transistor and make the inductance distribution more uniform as compared with a case where they are not provided. Uniformity of the inductance contributes to unification of the phases of the signals. As a result of this, the input and output RF signals can be made closer to a state of the same amplitude and the same phase, which makes it possible to achieve higher gain and higher output.

The configuration of the interruption circuits 18a and 18b is not limited to the configuration according to which they have the LC matching circuit and the choke coil, and any appropriate configuration can be adopted which blocks or attenuates radio frequency signals.

Note that the amplifying transistors 16a, 16b, 16c, 16d, the first dummy transistor 15a, and the second dummy transistor 15b have identical structures. Accordingly, when the RF current fluctuates due to conditions of use, or when the temperature, frequency in use, or operating power fluctuates, then the amount of variation in the characteristics of these transistors is uniform. By virtue of this, it is made possible to suppress variation in the amplitude and the phase of the propagation signals due to these fluctuations.

Embodiment 2

Figure 4:
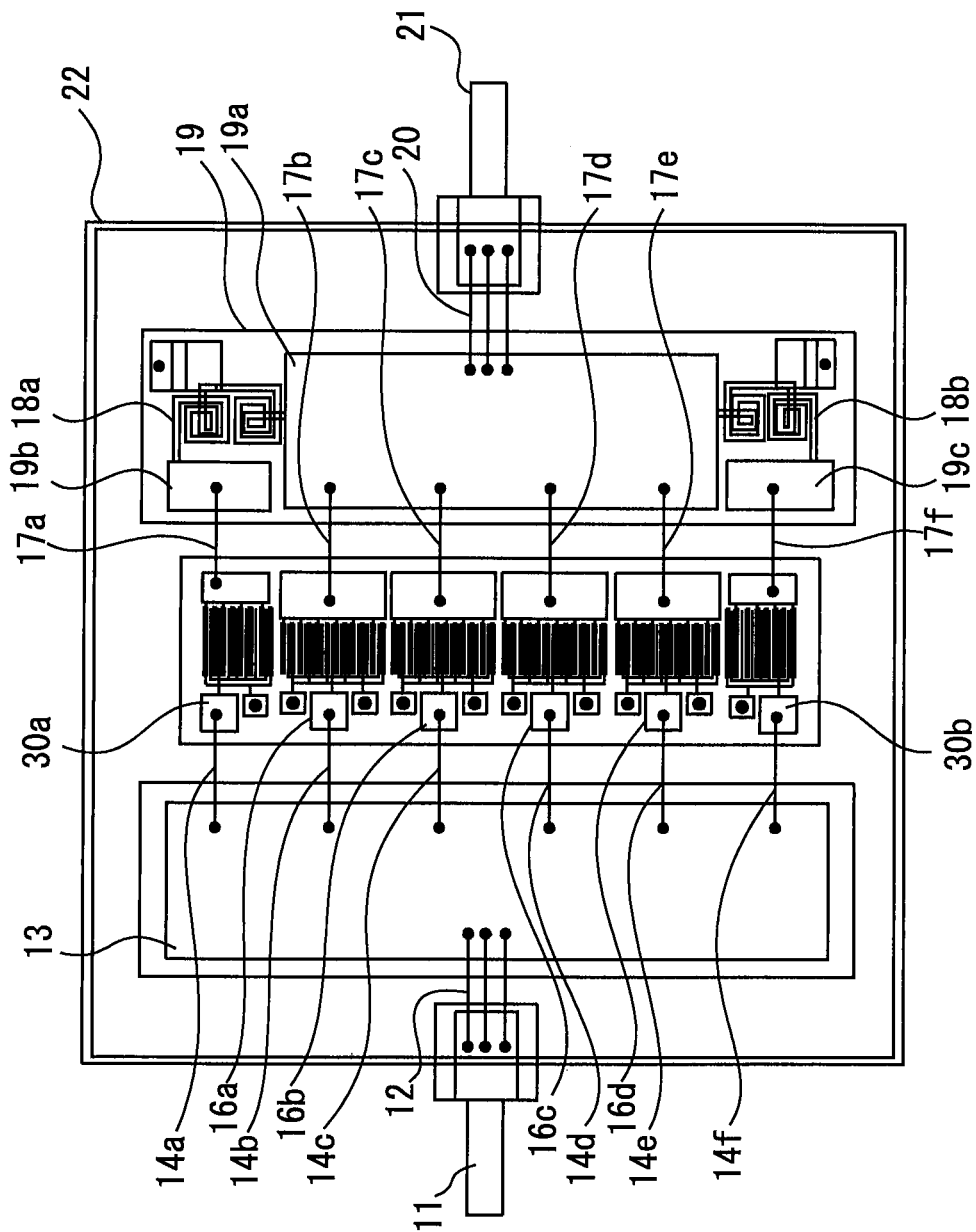
FIG. 4 is a plan view of an amplifier in accordance with Embodiment 2.

FIG. 4 is a plan view of an amplifier in accordance with Embodiment 2. In this amplifier, the transistor structure of first and second dummy transistors 30a and 30b is optimized so that the RF currents flowing in the first dummy transistor 30a, the second dummy transistor 30b, and the amplifying transistors 16a, 16b, 16c, 16d correspond to each other. Specifically, the structure of the first dummy transistor 30a and the second dummy transistor 30b is made different from the structure of the amplifying transistors 16a, 16b, 16c, and 16d, and thereby the current flowing in the first dummy transistor 30a and the second dummy transistor 30b is made to correspond to the current flowing in the amplifying transistors 16a, 16b, 16c, and 16d.

If all the transistors have identical structures, the RF current flowing in the dummy transistors will take a value different than that of the RF current of the amplifying transistors due to the influence of the mutual inductance. As a result, the dummy transistors will affect the mutual inductance of the amplifying transistors arranged adjacent to the dummy transistors. In view of this, in Embodiment 2, for example, by optimizing the electrode structure of the dummy transistors, the variation in the RF current caused by decrease in the inductance of the dummy transistors is compensated for. By virtue of this, the inductances of the amplifying transistors arranged to be adjacent to the dummy transistors can be made uniform with respect to the inductances of the other amplifying transistors. By virtue of this, the propagation signals can be made closer to a state of the same amplitude and the same phase, which makes it possible to achieve higher gain and higher output.

In order to make the current flowing in the first dummy transistor 30a and the second dummy transistor 30b correspond to the current flowing in the amplifying transistors 16a, 16b, 16c, 16d, the width of the gate, the length of the gate, or the number of the fingers of the first dummy transistor 30a and the second dummy transistor 30b can be specified according to a desired output power.

For example, if the structure of the first and second dummy transistors 30a, 30b and the structure of the amplifying transistors 16a, 16b, 16c, 16d are unified, a larger current may flow in the first and second dummy transistors 30a, 30b than the current flowing in the amplifying transistors 16a, 16b, 16c, 16d. In this case, the width of the gate of the first and second dummy transistors 30a, 30b may be made smaller than the width of the gate of the amplifying transistors 16a, 16b, 16c, 16d; the length of the gate of the first and second dummy transistors 30a, 30b may be made larger than the length of the gate of the amplifying transistors; or the number of the fingers of the first and second dummy transistors 30a, 30b may be made smaller than the number of the fingers of the amplifying transistors 16a, 16b, 16c, 16d.

Embodiment 3

Figure 5:
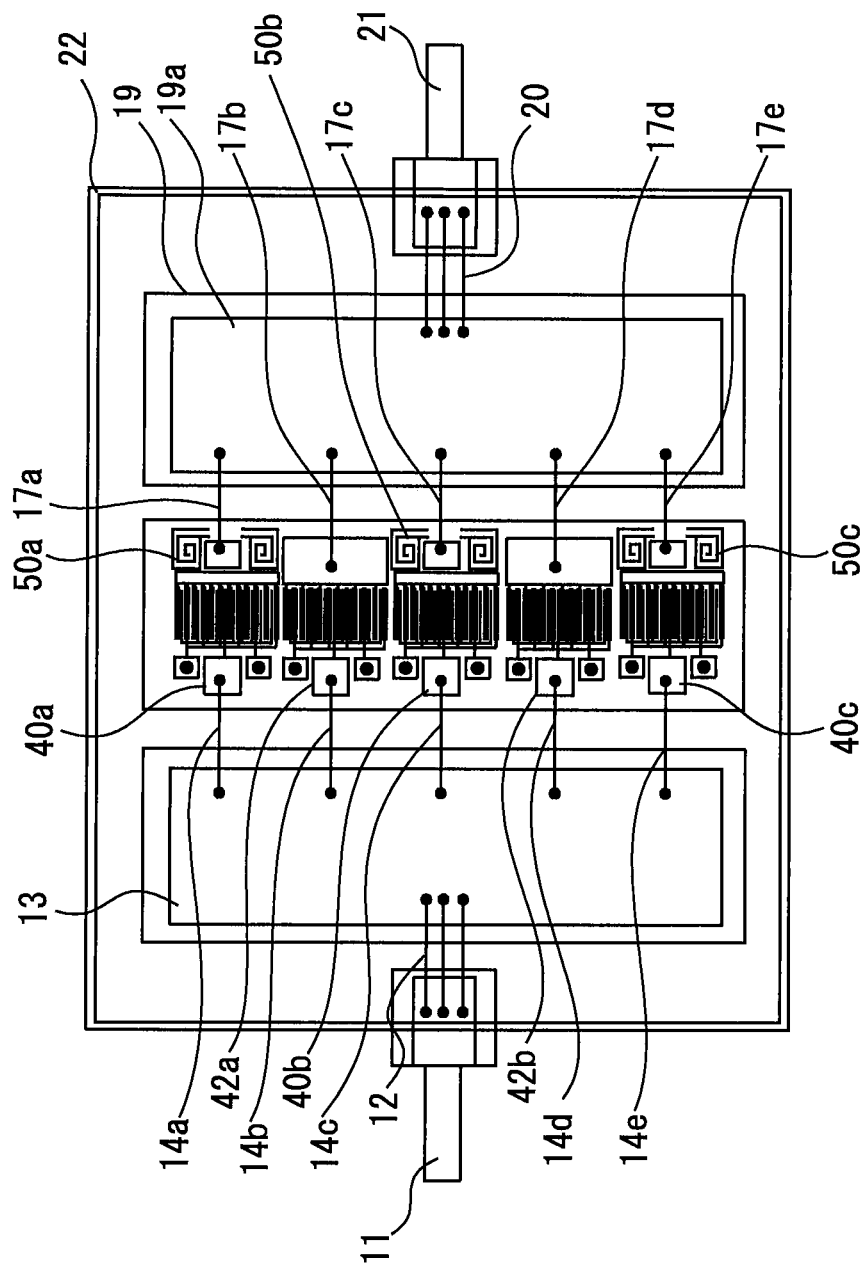
FIG. 5 is a plan view of an amplifier in accordance with Embodiment 3.

FIG. 5 is a plan view of an amplifier in accordance with Embodiment 3. In this amplifier, the amplifying transistors and the dummy transistors are alternately arranged. In FIG. 5, a configuration is illustrated in which a first dummy transistor 40a, an amplifying transistor 42a, a second dummy transistor 40b, an additional amplifying transistor 42b, and a third dummy transistor 40c are arranged in a row in this order. The first dummy transistor 40a, the amplifying transistor 42a, the second dummy transistor 40b, the additional amplifying transistor 42b, and the third dummy transistor 40c individually receive a signal from the input matching circuit. In addition, the output signals of the amplifying transistor 42a and the additional amplifying transistor 42b are output to the output matching circuit 19 and transmitted to the output terminal 21.

The first, second, and third dummy transistors 40a, 40b, and 40c receive signals from the input matching circuit 13 and amplify these signals, but the signals that have been amplified are blocked by interruption circuits 50a, 50b, and 50c, respectively. As a result, the outputs of the first, second, and third dummy transistors 40a, 40b, and 40c are not transmitted to the output terminal 21. The interruption circuits 50a, 50b, and 50c are configured, for example, by an LC matching circuit having a MIM capacitor connected to a via hole which is grounded and a spiral inductor, and a choke coil. These interruption circuits can be configured to have, for example, a configuration identical with that of the interruption circuit 18a of FIG. 3.

For example, the first, second, and third dummy transistors 40a, 40b, and 40c can be configured as transistors having a multi-finger structure. For the first, second, and third dummy transistors 40a, 40b, 40c, the length of the gate, the width of the gate, or the number of the fingers is specified considering the influence of the mutual inductance upon the amplifying transistors, and layouts are defined such that the number of the fingers can be modified. The RF current flowing in the dummy transistors can be controlled by adjusting the number of the fingers to be used in the dummy transistors. By virtue of this adjustment, as the mutual inductance occurs according to the RF current flowing in the dummy transistor, the inductance of the amplifying transistor can be controlled. In other words, the input impedance of the amplifying transistor can be adjusted by adjusting the number of the fingers used in the dummy transistors. Specifically, the input impedance of the amplifying transistor 42a can be adjusted by adjusting the number of the fingers of the first dummy transistor 40a and the second dummy transistor 40b, and the input impedance of the additional amplifying transistor 42b can be adjusted by adjusting the number of the fingers of the second dummy transistor 40b and the third dummy transistor 40c.

Figure 6:
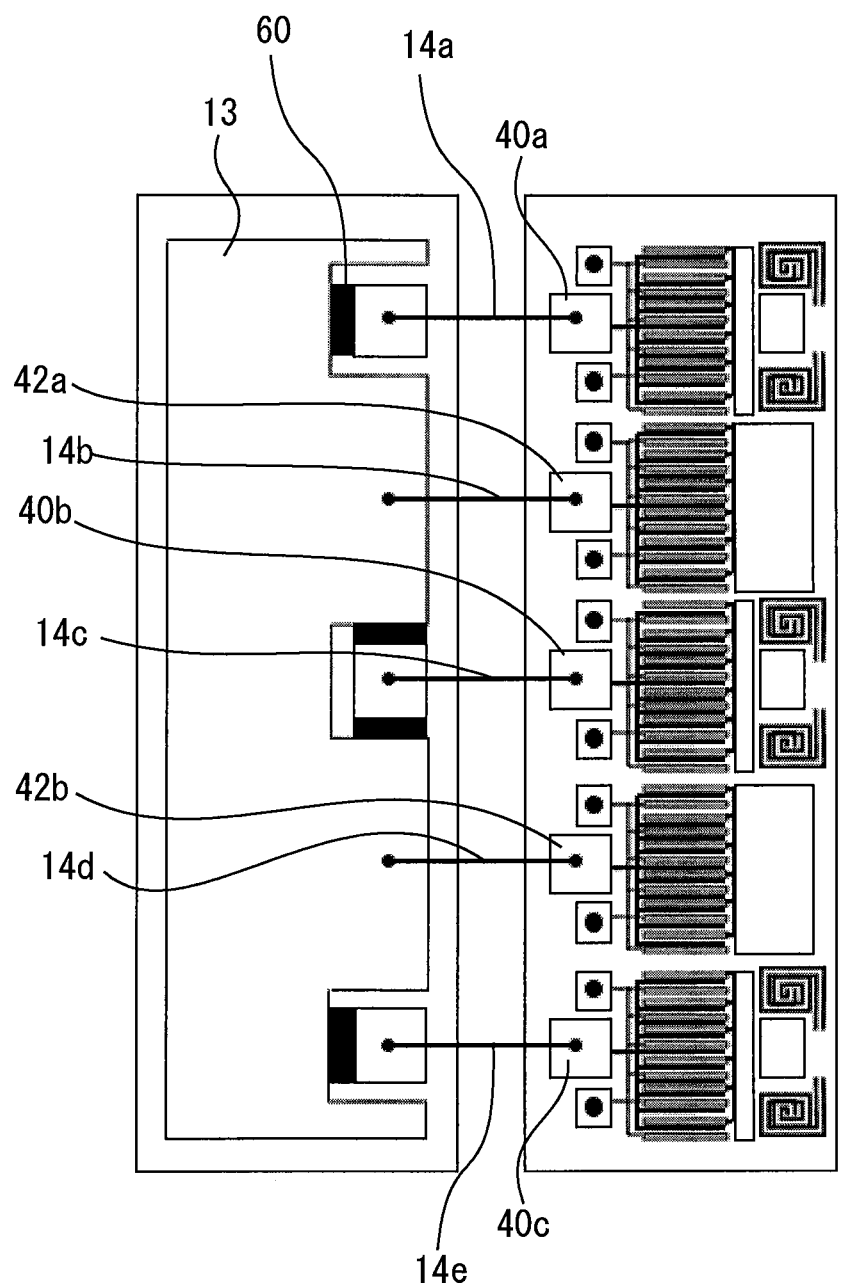
FIG. 6 is a diagram illustrating an example of impedance adjustment.
Figure 7:
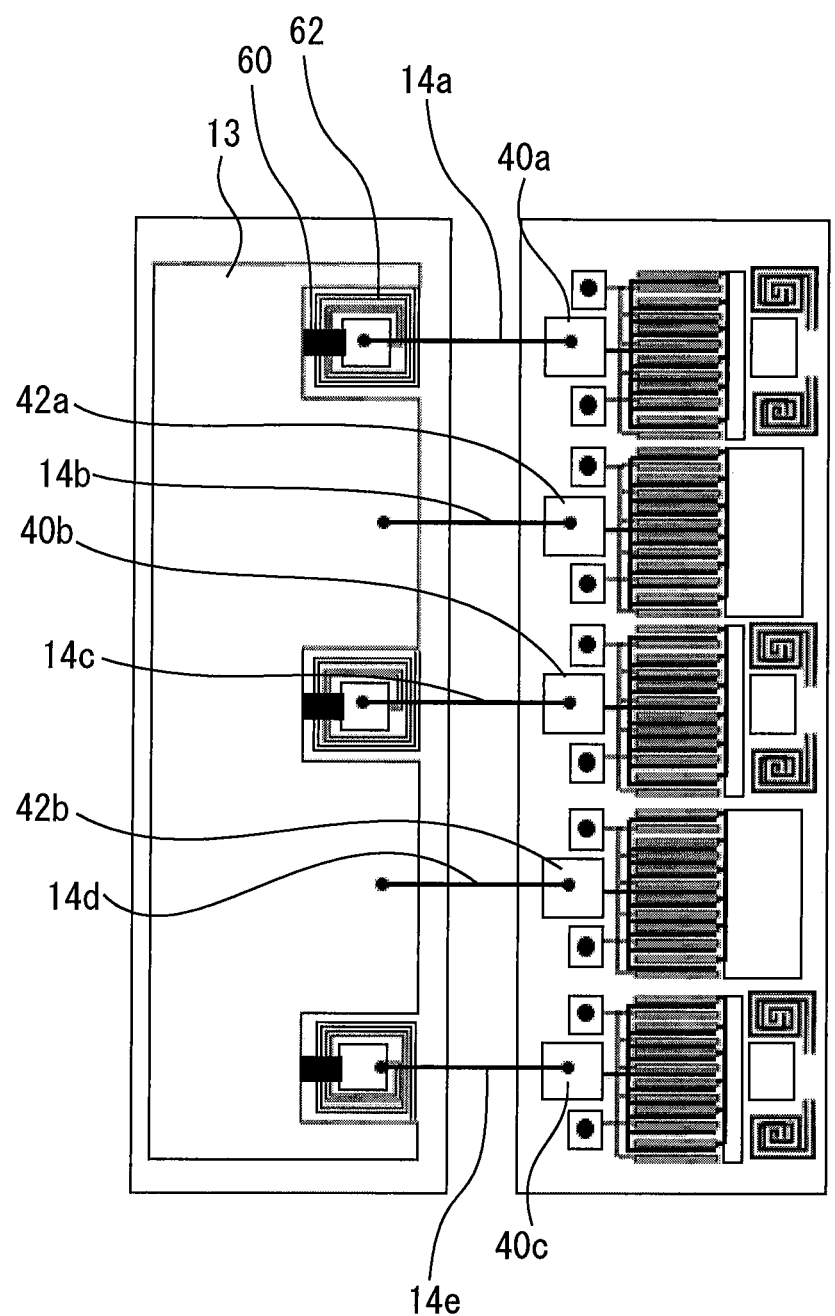
FIG. 7 is a diagram illustrating an example of impedance adjustment.
Figure 8:
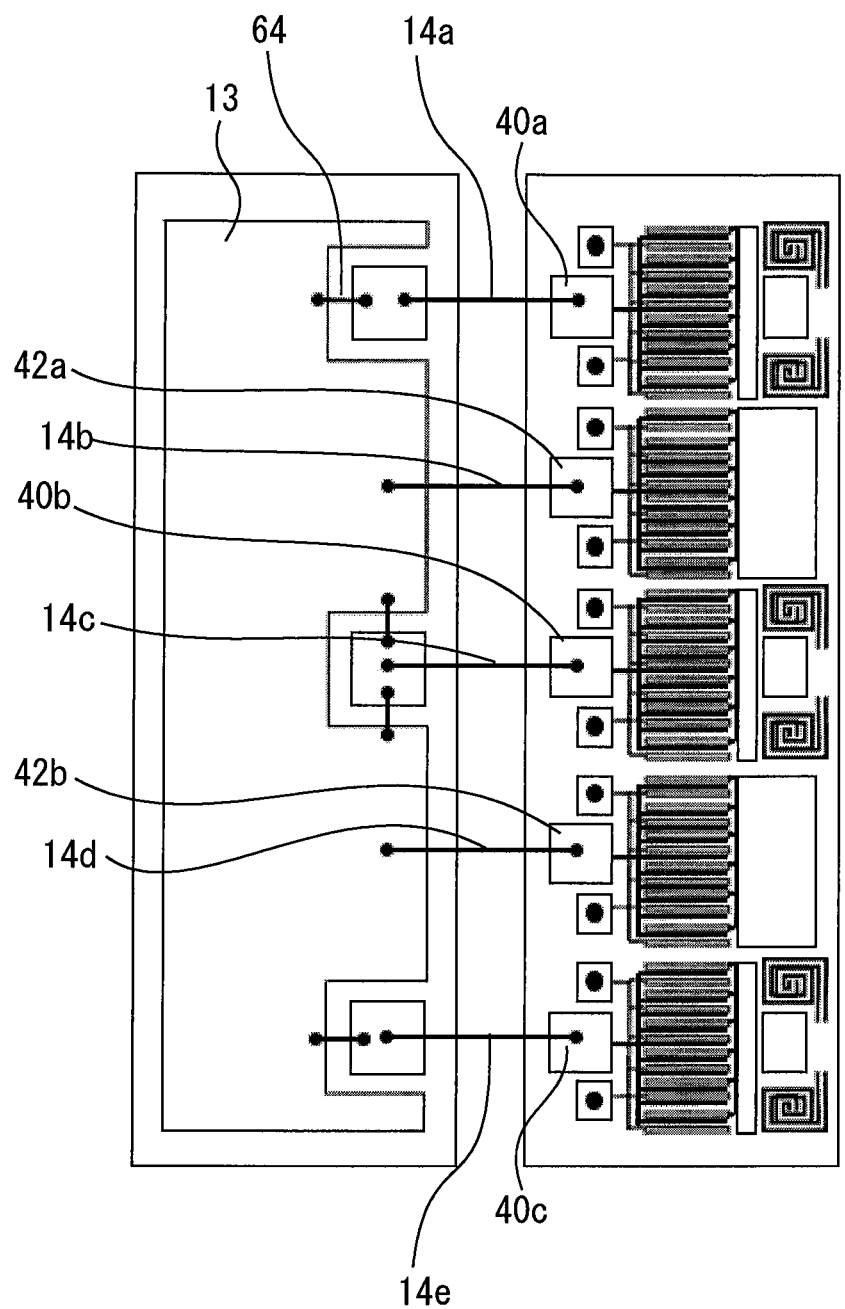
FIG. 8 is a diagram illustrating an example of impedance adjustment.
Figure 9:
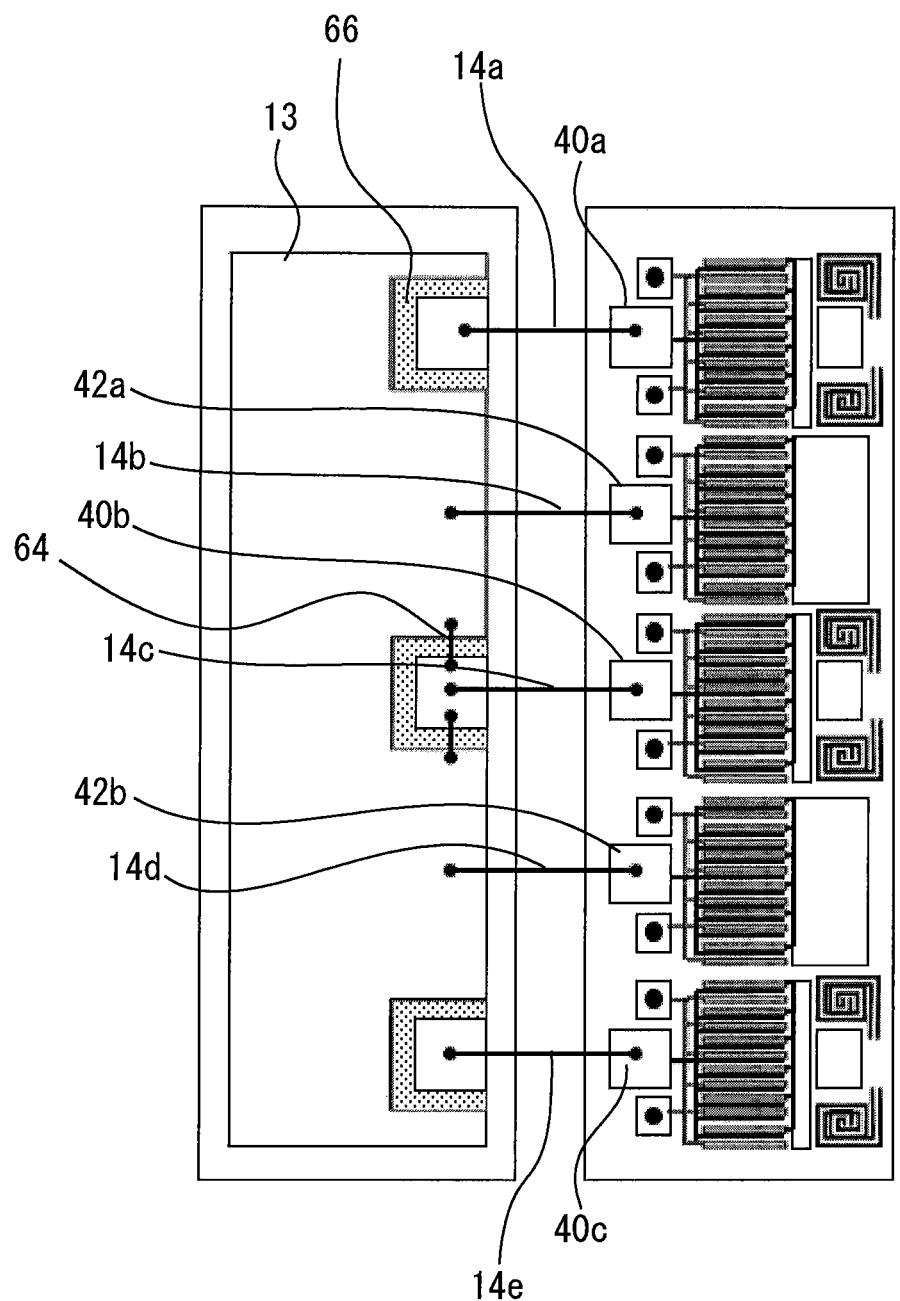
FIG. 9 is a diagram illustrating an example of impedance adjustment.

The input matching circuit 13 connected to the dummy transistor can be configured to have a pattern layout which is adjustable according to the number of the fingers of the dummy transistor. The adjustment in this context means optimization of the impedance to control the amount of current flowing in the bonding wire according to the number of the fingers of the dummy transistors. As controlling impedance means control of the amount of current flowing in the dummy transistor, it has the meaning equivalent to modification of the number of the fingers. Accordingly, the input impedance of the amplifying transistor 42a and the additional amplifying transistor 42b can be adjusted by adopting either or both of adjustment of the number of the fingers used in the dummy transistor and the impedance control through adjustment of the pattern layout of the input matching circuit 13. Examples of the adjustment of the pattern layout of the input matching circuit 13 are illustrated in FIGS. 6 to 9. FIG. 6 depicts adjustment of the impedance through the position of a connection ribbon 60. FIG. 7 depicts adjustment of the impedance through the connection ribbon 60 and a spiral inductor 62. FIG. 8 depicts adjustment of the impedance through the position of a connection wire bond 64. FIG. 9 depicts adjustment of the impedance through the position of the connection wire bond 64 and provision of a resistive film 66. These examples share the common feature that an impedance adjusting unit for the dummy transistor is provided in the input matching circuit 13. The impedance may also be adjusted using any appropriate method other than those depicted in FIGS. 6 to 9.

DESCRIPTION OF SYMBOLS

13 Input matching circuit, 16a, 16b, 16c, 16d Amplifying transistor, 15a First dummy transistor, 15b Second dummy transistor, 19 Output matching circuit

The invention claimed is:

1. An amplifier comprising:
an input matching circuit;
at least one amplifying transistor configured to receive a signal from the input matching circuit via a bonding wire;
a first dummy transistor configured to receive a signal from the input matching circuit via a bonding wire;
a second dummy transistor configured to receive a signal from the input matching circuit via a bonding wire;
an interruption circuit configured to block outputs of the first dummy transistor and the second dummy transistor, and
an output matching circuit configured to output an output of the amplifying transistor, wherein
the amplifying transistor being arranged between the first dummy transistor and the second dummy transistor,
the amplifying transistor, the first dummy transistor, and the second dummy transistor being provided in a row along the input matching circuit, and
the interruption circuit is configured to block signals that have been amplified by the first dummy transistor and the second dummy transistor.

2. An amplifier comprising:
an input matching circuit;
at least one amplifying transistor configured to receive a signal from the input matching circuit;
a first dummy transistor configured to receive a signal from the input matching circuit;
a second dummy transistor configured to receive a signal from the input matching circuit;
an interruption circuit configured to block outputs of the first dummy transistor and the second dummy transistor, and
an output matching circuit configured to output an output of the amplifying transistor, wherein
the amplifying transistor being arranged between the first dummy transistor and the second dummy transistor,
the amplifying transistor, the first dummy transistor, and the second dummy transistor being provided in a row along the input matching circuit,
the interruption circuit has an LC matching circuit and a choke coil, and
the interruption circuit is configured to block signals that have been amplified by the first dummy transistor and the second dummy transistor.

3. An amplifier comprising:
an input matching circuit;
at least one amplifying transistor configured to receive a signal from the input matching circuit;
a first dummy transistor configured to receive a signal from the input matching circuit;
a second dummy transistor configured to receive a signal from the input matching circuit;
an output matching circuit configured to output an output of the amplifying transistor, and
an interruption circuit configured to block outputs of the first dummy transistor and the second dummy transistor, wherein
the amplifying transistor being arranged between the first dummy transistor and the second dummy transistor,
the amplifying transistor, the first dummy transistor, and the second dummy transistor being provided in a row along the input matching circuit,
the interruption circuit is configured to block signals that have been amplified by the first dummy transistor and the second dummy transistor, and
a current flowing in the first dummy transistor and the second dummy transistor is made to correspond to a current flowing in the amplifying transistor by making structures of the first dummy transistor and the second dummy transistor different from a structure of the amplifying transistor.

4. An amplifier comprising:
an input matching circuit;
at least one amplifying transistor configured to receive a signal from the input matching circuit;
a first dummy transistor configured to receive a signal from the input matching circuit;
a second dummy transistor configured to receive a signal from the input matching circuit;
an output matching circuit configured to output an output of the amplifying transistor;
an additional amplifying transistor configured to receive a signal from the input matching circuit and outputs a signal to the output matching circuit;
a third dummy transistor configured to receive a signal from the input matching circuit, and
an interruption circuit configured to block outputs of the first dummy transistor, the second dummy transistor, and the third dummy transistor, wherein
the amplifying transistor being arranged between the first dummy transistor and the second dummy transistor,
the amplifying transistor, the first dummy transistor, and the second dummy transistor being provided in a row along the input matching circuit,
the additional amplifying transistor is arranged between the second dummy transistor and the third dummy transistor,
the first dummy transistor, the second dummy transistor, and the third dummy transistor are transistors having a multi-finger structure, and
the interruption circuit is configured to block signals that have been amplified by the first dummy transistor, the second dummy transistor, and the third dummy transistor.

5. The amplifier according to claim 4, wherein an impedance adjustor for the first dummy transistor, the second dummy transistor, and the third dummy transistor is provided in the input matching circuit.

* * * * *